(12) United States Patent
Diduck et al.

(10) Patent No.: US 7,576,353 B2
(45) Date of Patent: Aug. 18, 2009

(54) BALLISTIC DEFLECTION TRANSISTOR AND LOGIC CIRCUITS BASED ON SAME

(75) Inventors: Quentin Diduck, Ithaca, NY (US); Martin Margala, Westford, MA (US)

(73) Assignee: University of Rochester, Rochester, NY (US)

( * ) Notice: Subject to any disclaimer, the term of this patent is extended or adjusted under 35 U.S.C. 154(b) by 152 days.

(21) Appl. No.: 11/878,434

(22) Filed: Jul. 24, 2007

(65) Prior Publication Data

US 2008/0136454 A1 Jun. 12, 2008

Related U.S. Application Data

(60) Provisional application No. 60/832,597, filed on Jul. 24, 2006, provisional application No. 60/580,374, filed on Jun. 18, 2004.

(51) Int. Cl.
*H03K 19/00* (2006.01)
*H01L 29/12* (2006.01)
*H01L 21/334* (2006.01)

(52) U.S. Cl. ............... 257/29; 257/24; 257/26; 257/E29.069; 257/E21.395

(58) Field of Classification Search ............ 257/24, 257/26, 29, E29.069, E21.395; 438/283; 326/102
See application file for complete search history.

(56) References Cited

U.S. PATENT DOCUMENTS

| 5,289,077 | A * | 2/1994 | Ugajin ............... 313/308 |
| 2004/0027154 | A1 | 2/2004 | Samuelson et al. |
| 2005/0067615 | A1 | 3/2005 | Yoshii et al. |
| 2006/0035173 | A1 | 2/2006 | Davidson et al. |

OTHER PUBLICATIONS

Song, A.M. et al., "Nonlinear Electron Transport in an Asymmetric Microjuntion: A Ballistic Rectifier," Physical Review Letters, vol. 80, No. 17, Apr. 27, 1998, pp. 3831-3834.
Song, A.M., "Room-Temperature Ballistic Nanodevices", Encyclopeida of Nanoscience and Nanotechnology, vol. X, American Scientific Publishers 2004, pp. 1-19.

* cited by examiner

*Primary Examiner*—Victor A Mandala
*Assistant Examiner*—Scott Stowe
(74) *Attorney, Agent, or Firm*—Blank Rome LLP

(57) ABSTRACT

A quantum well is formed in a substrate to define a hub, ports extending from the hub, and a deflective structure in the hub. Electrons move through the hub and ports according to the ballistic electron effect. Gates control the movement of the electrons, causing them to be incident on the deflective structure on one side or the other, thus controlling the direction in which they are deflected and the port through which they pass.

23 Claims, 14 Drawing Sheets

BALLISTIC DEFLECTION TRANSISTOR AND LOGIC CIRCUITS BASED ON SAME

REFERENCE TO RELATED APPLICATIONS

The present application claims the benefit of U.S. Provisional Patent Application No. 60/832,597, filed Jul. 24, 2006, which in turn builds on concepts originally disclosed in U.S. Provisional Patent Application No. 60/580,374, filed Jun. 18, 2004. The disclosures of both of those applications are hereby incorporated by reference in their entireties into the present application.

STATEMENT OF GOVERNMENT INTEREST

The work leading to the present invention was supported in part by the Office of Naval Research, Grant No. N000140510052. The government has certain rights in the invention.

FIELD OF THE INVENTION

The present invention is directed to a transistor and more specifically to a transistor based on the geometrical deflection of ballistic current. The invention is further directed to logic circuits using such a transistor.

DESCRIPTION OF RELATED ART

Several different techniques have been attempted to increase the operating speed of transistors beyond the Terahertz barrier. These include Heterojunction Bipolar Transistors (HBT), High Electron Mobility Transistors (HEMT), Static Induction Transistors (SIT), superconducting Josephson junctions and their derivatives.

However, these devices all suffer at least one of the following disadvantages: (1) The use of a junction that creates temperature sensitive operation, (2) the junction capacitance limits frequency of operation, (3) long electron transit times, (4) the requirement of multiple precision fabrication steps, (5) the requirement of cooling to temperatures below 300K.

In a different field of endeavor, it is understood that if the active area of a mesoscopic device is smaller than the mean free path for electron scattering, the electron transport is "ballistic" rather than diffusive (Ohm's law). The word "ballistic" is used for two distinct concepts. In one sense, it refers to the transport of an electron from point A to point B without scattering. The nature of the transport, whether wavelike or particle-like, whether phase coherent or Newtonian, is not specified. In the less technical sense the "ballistic" electron refers to the "billiard model" in the sense of a ballistic missile or projectile.

In the first sense, ballistic transport has been studied for many years. The generally accepted theory describing ballistic transport is the Landauer-Büttiker theory. It describes conduction as the sum of transverse confinement modes. If a channel in a two-dimensional conductor is narrower than an electron's Fermi wavelength, no current can flow. For wider channels, electrons can occupy modes that are multiples of the Fermi half-wavelength in the transverse direction, exactly like microwaves propagating in a waveguide. Only those electrons whose energy falls near the Fermi circle can transport current.

Clearly, the Landauer-Büttiker theory is a purely wavelike, not particle-like picture. It has been very successful in predicting the low temperature properties of mesostructures. It predicts the quantized conductance of microchannels, the quantum Hall effect, and many other striking phenomena in various types of ballistic structures. It is less useful, however, at room temperature. One reason is practical, that the electron mean free path determined by phonon scattering becomes smaller, to at most several hundred nm in any material at room temperature, so the ballistic regime is more difficult to reach. Another reason is that wave phenomena require phase coherence of the electron wave function or other wave-like properties of electron transport. A third reason is that the thermal energy at room temperature, kT=26 meV, is larger than the typical energy spacing of the transverse confinement modes, so it is not possible to observe any effects which require energy level quantization.

In the past several years a number of experiments have demonstrated ballistic deflection nonlinear effects in mesostructures that are quite robust at room temperature. The room temperature ballistic nonlinearities involve particle-like conduction—the electrons appear to behave like billiards. However, such effects have not been applied to address the above-noted problems of known terahertz transistors.

SUMMARY OF THE INVENTION

There is thus a need in the art to overcome the above-noted disadvantages of known terahertz transistors.

It is therefore an object of the invention to overcome those advantages, using the ballistic effect.

It is another object of the invention to do so using the room-temperature ballistic effect.

It is still another object of the invention to do so with reduced noise and reduced power consumption.

To achieve the above and other objects, the present invention utilizes a non-linearity observed in ballistic rectifiers, which is based upon the ballistic electron effect, where device feature size is small in relation to the mean free path of electrons. The net effect is that electrons behave in a semi-classical way under these conditions, and deflective structures can be used to alter the current-voltage characteristic. Fields can be used to control the path of the electrons in such a structure. By placing capacitive structures in proximity of the rectifying structure, one could alter the path of the electrons and thus where the electrons would hit the deflective structure. If one biases a current so that electrons would have a preferred path towards the deflector, such that small changes in path would result in large changes in deflection angle, an applied field to a capacitive structure can be used to select the path of those electrons. By utilizing these effects and creating a structure that can control the path of the electrons, forms a new transistor device.

This invention combines the above-noted non-linearity which is based upon ballistic electron effects whereby small deflective structures can be used to alter the current-voltage characteristic, and an electron field effect whereby electron path can be altered by the application of a small electric field to create a transistor device. This is achieved in one embodiment where deflective structure(s) input and output conductive path(s) are created in a 2D heterostructure based electron gas. Alongside or near the conductive paths or alongside or near the deflective structure, capacitive or inductive structures are created to enable the alteration of the electron path. By using electric or magnetic fields to guide the electrons to a deflective structure, the electron path can be selected to one or multiple output paths. In at least one embodiment, capacitive structures are used to alter the path of the electrons, which are sourced from the bottom of the figure towards the top. Applying either a positive or a negative electric field will alter the current path to the left or to the right port of the device. If no field is applied, the electron path will be deflected equally to the left and to the right. This structure can be further modified such that there are more than 2 output ports, and the deflective geometry can be altered such that there are multiple deflection points, which may enhance functionality. The deflector may be composed of multiple structures to create a desired deflective or transmissive effect. In addition both inductive and capacitive structures can be used and located elsewhere in the structure without loss of functionality.

The shape of the deflective structure can be of any geometry provided that it acts to deflect electrons when the angle of incidence to the structure is altered. The deflective structure may be composed of multiple geometries and may in fact be integrated into the port structure. The deflective structure is contained in, or part of, a central manifold where all ports interface.

The shape of the ports can be of any geometry such that it makes them suitable for the reception of electrons. A minimum size of the opening of the port is required such that electrons may enter into the port. The port is preferably designed to accommodate the geometry of the deflector and to enhance the deflector effect.

The heterostructure material is preferably made from a material with an electron mean free path on the order of or larger than the deflector size. Also the material preferably has high conductivity with few natural defects in the conducting region.

This device and its design methodology are appropriate for use in sensors, analog circuits, digital circuits, RF sources, THz radiation, or antenna.

There is therefore provided according to an aspect of the invention a transistor device for transforming resistance, the transistor comprising a heterostructure material where a small deflective structure is formed, surrounded by input and output ports, all of which are formed by alteration of the crystal structure such that only the ports and central hub are the preferred conductive paths.

A bias can be applied to all the output terminals. Bias resistors can be used to bias the device for gain operation.

BRIEF DESCRIPTION OF THE DRAWINGS

Preferred embodiments of the invention will now be described with reference to the figures by way of example where like characters denote like elements and in which.

DETAILED DESCRIPTION OF THE PREFERRED EMBODIMENTS

Figure 1:
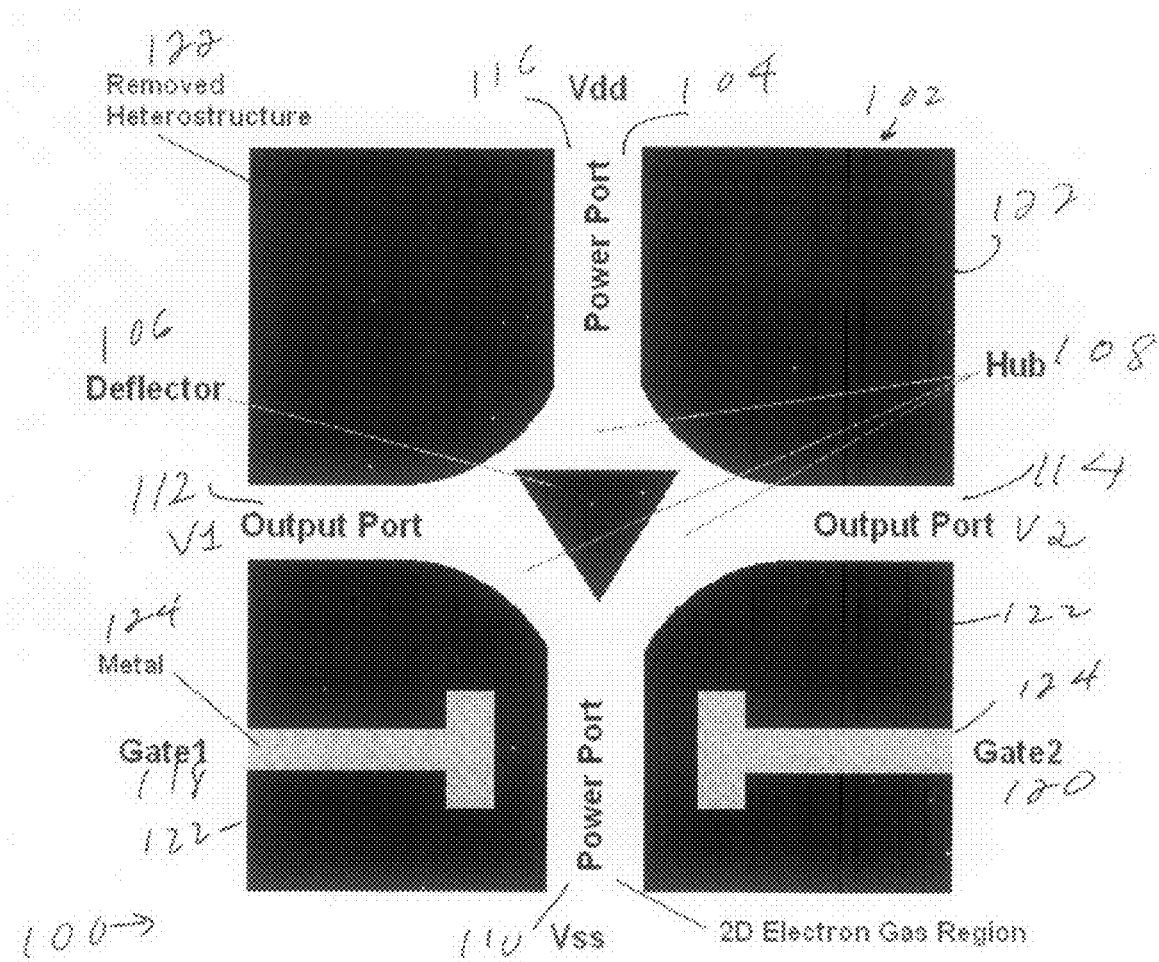
FIG. 1 is an embodiment of a ballistic deflection transistor, which has two outputs ports labeled V1 and V2 and two input ports labeled Vss and Vdd.

Preferred embodiments of the present invention will now be set forth in detail with reference to the drawings, in which like reference numerals refer to like elements throughout.

A preferred embodiment of the invention is shown in FIG. 1, where a transistor 100 is fabricated by etching a structure of given width and height and thickness into an InP substrate 102 and doping the structure such that a quantum well 104 composed of InGaAs—InP or InGaAs—AlGaAs enables the formation of the deflective structure 106, hub 108 and ports 110, 112, 114, 116. Gates 118, 120 are preferably formed by the application of two parallel strips of conductive material near the Vss port 110, preferably near the hub 108, in parallel to the Vss port 110. Another way to form the gates 118, 120 is by isolating semiconductor by an etch so as to isolate the gate regions from the channel regions. The ports and gates have conductive contacts, such as metal contacts, that connect the transistor to power source(s), input source(s), and/or output source(s). FIG. 1 also indicates the areas 122 that are etched away to create the deflective structure, hub and ports, as well as the material 124 added to create the gates.

The quantum well 104 defines a 2DEG with high electrical conductivity, with dimensions comparable to the mean free path, while the areas 122 have zero conductivity. A bias voltage applied at port 116 Vdd accelerates electrons from port 110 Vss towards the hub 108 of the BDT. A small gate voltage modifies the path of the electrons towards the right or the left as desired. These electrons are then ballistically deflected from the deflective structure 106 into one or the other output channels 112, 114. This ballistic deflection magnifies the effect of the gated nonlinear conduction and is responsible for the gain of the BDT. A small deviation at the gate results in a large deflection at the output.

Figure 2:
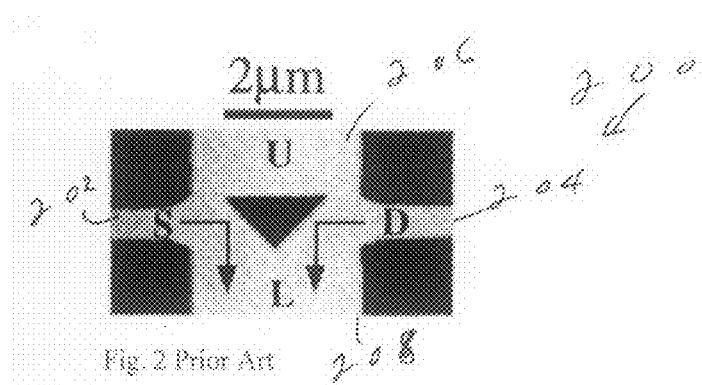
FIG. 2 shows a ballistic bridge rectifier, as described by A. M. Song, A. Lorke, A. Kriele, and J. P. Kotthaus, "Nonlinear Electron Transport in an Asymmetric Microjunction: A Ballistic Rectifier", *Physical Review Letters*, Vol 80, No 17, 27 Apr. 1998.
Figure 3:
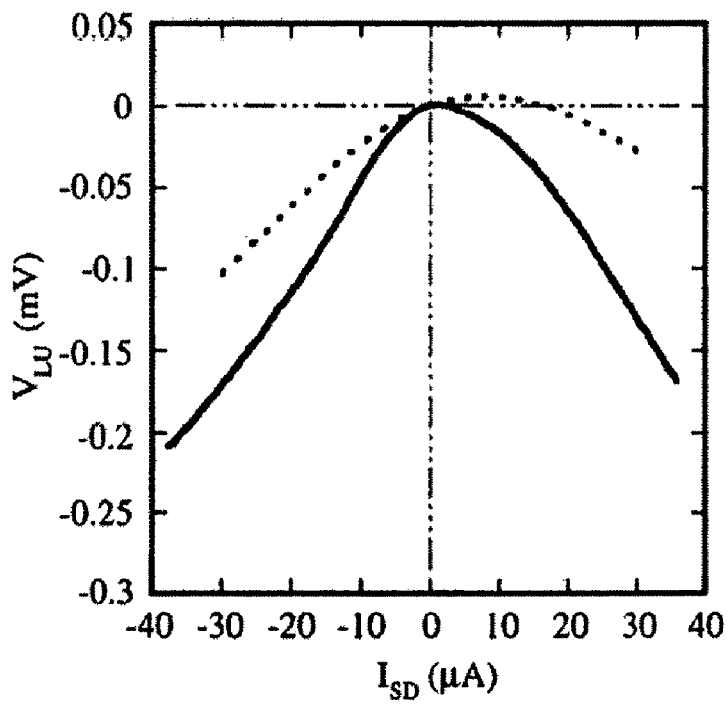
FIG. 3 shows the I-V curves of a of a ballistic bridge rectifier at 4.2 K (solid lines) and 77 K (dashed lines). In the geometry where the symmetry is broken with respect to the current path, $V_{LU}$ vs $I_{SD}$, as described by A. M. Song, A. Lorke, A. Kriele, and J. P. Kotthaus, "Nonlinear Electron Transport in an Asymmetric Microjunction: A Ballistic Rectifier", *Physical Review Letters*, Vol 80, No 17 27 Apr. 1998.

The BDT is an adaptation of a related device called the "ballistic rectifier" 200, shown in FIG. 2. In the rectifier experiments, an rf source is connected across the left and right contacts 202, 204. The experimental result is that a DC voltage is developed across the top to the bottom contacts 206, 208. FIG. 8 shows the I-V curves. This has been demonstrated by several different groups at room temperature, at frequencies up to 50 GHz. It is remarkable that this rectification is not predicted by any accepted theory. Diffusive (Ohm's law) conduction is linear, and there can be no frequency conversion. Landauer-Büttiker theory predicts no rectification either, because of reciprocity. However, the ballistic rectifier (and various other experiments) can be understood, qualitatively at least, by a simple concept—that the electrons in the 2DEG behave as if they were classical Newtonian charged particles. They respond to electromagnetic fields, but they otherwise travel in straight paths until they encounter obstacles, from which they are reflected. Thus the asymmetric triangular structures seen in FIG. 1 deflect the electrons downward, and this causes the rectification.

Like the ballistic rectifier, the BDT will operate at room temperature. The BDT is a planar structure, so all of its capacitances including the gate capacitance are extremely small, measured in attofarads, and this should allow a sub-picosecond response time and THz operation. The major materials requirement is that the active region of the BDT must be smaller than or comparable to the electron mean free path at room temperature, to achieve ballistic transport, and this can be achieved with a 2DEG heterostructure with meso-structures defined by electron-beam lithography.

As an example, we describe the fabrication of a device suitable to operate in the low THz frequency range. The fabrication of the ballistic deflection transistor starts from an InGaAs substrate that is modulation doped such that an $In_{0.75}Ga_{0.25}As/InP$ quantum well structure is created. The properties of this structure are such that the electrons are confined to a two-dimensional electron gas in a 9 nm thick quantum well located 40 nm below the surface. The ports, hub, and triangular deflective structure are defined using electron beam lithography and wet chemical etching. In FIG. 1 the areas 122 are etched away to create the structures. Contacts for the ports and gates of 100 nm width and 50 nm length composed of a gold-gallium amalgam are then placed on top of the structure using electron beam lithography techniques.

Figure 4:
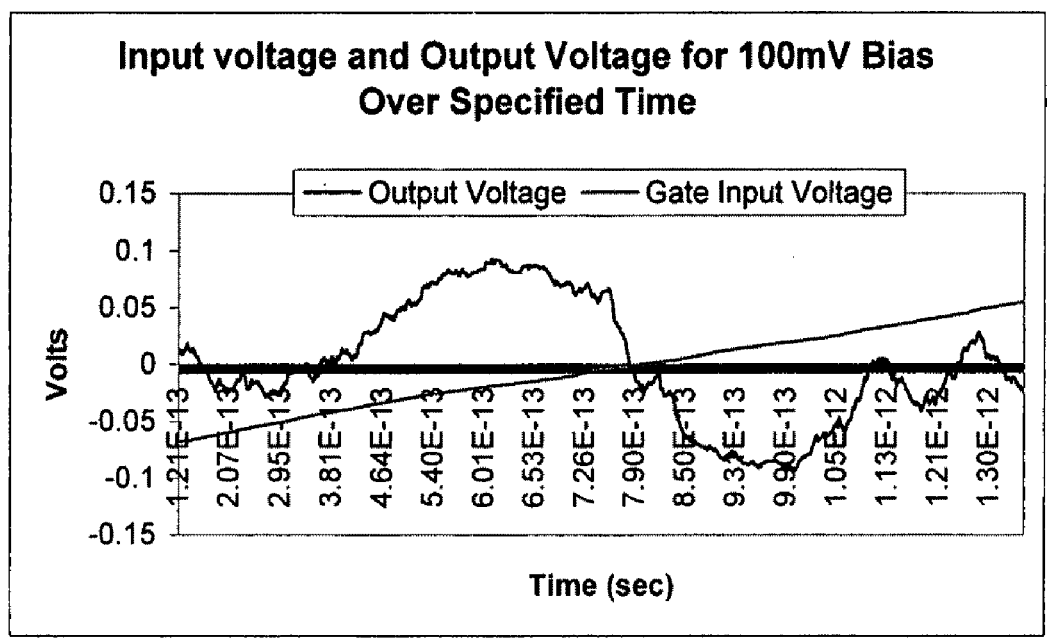
FIG. 4 is a simulation result of a ballistic deflection transistor when a high frequency ramp signal is applied to the gates of the device.

The preferred process to operate the device requires a bias voltage of 50 mV which is applied to the port 116 Vdd and a voltage of negative 50 mV applied to the port 110 Vss. The source of the signal will be connected to the gates. The output port 112 V1 will produce an amplified signal of the source; the output port 114 V2 will produce an inverse amplified signal. The voltage amplification for the given geometry with 70 nm gates will be approximately 17.5 times the input signal provided the input signal does not cause saturation. FIG. 4 shows the simulation results of and I-V curve for a ramp function over a short time interval when the gates were 20 nm in width, resulting in a voltage gain of 5.

Figure 5:
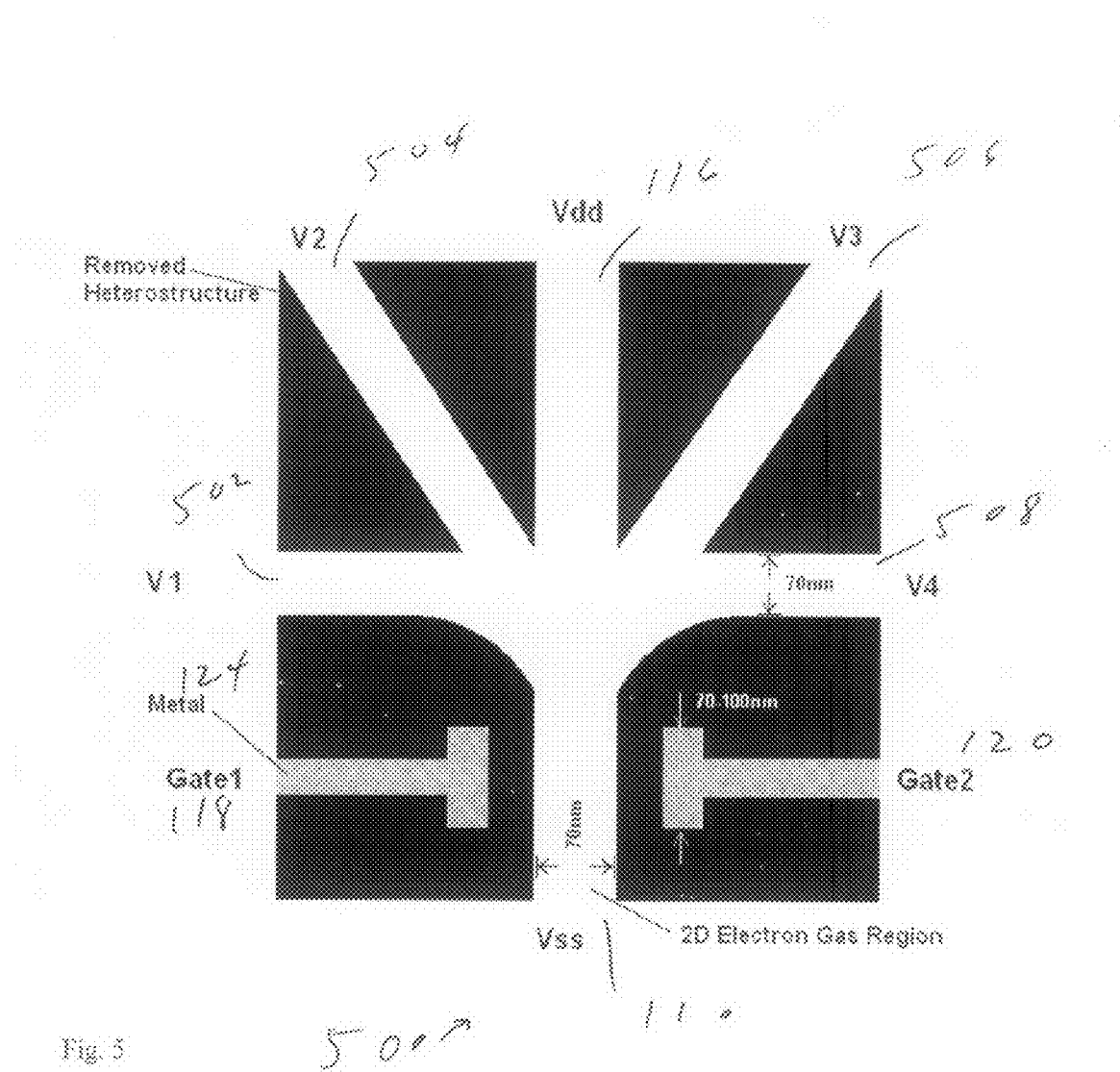
FIG. 5 is a multiport variant of a ballistic deflection transistor that uses the port interfaces to the hub as the deflective structure.

Variations will now be described. The transistor 500 of FIG. 5 has four output ports V1 502, V2 504, V3 506, V4 508. The deflector 106 is replaced by deflective portions 510 defined by the junctions of the various ports in the hub 512.

Figure 6:
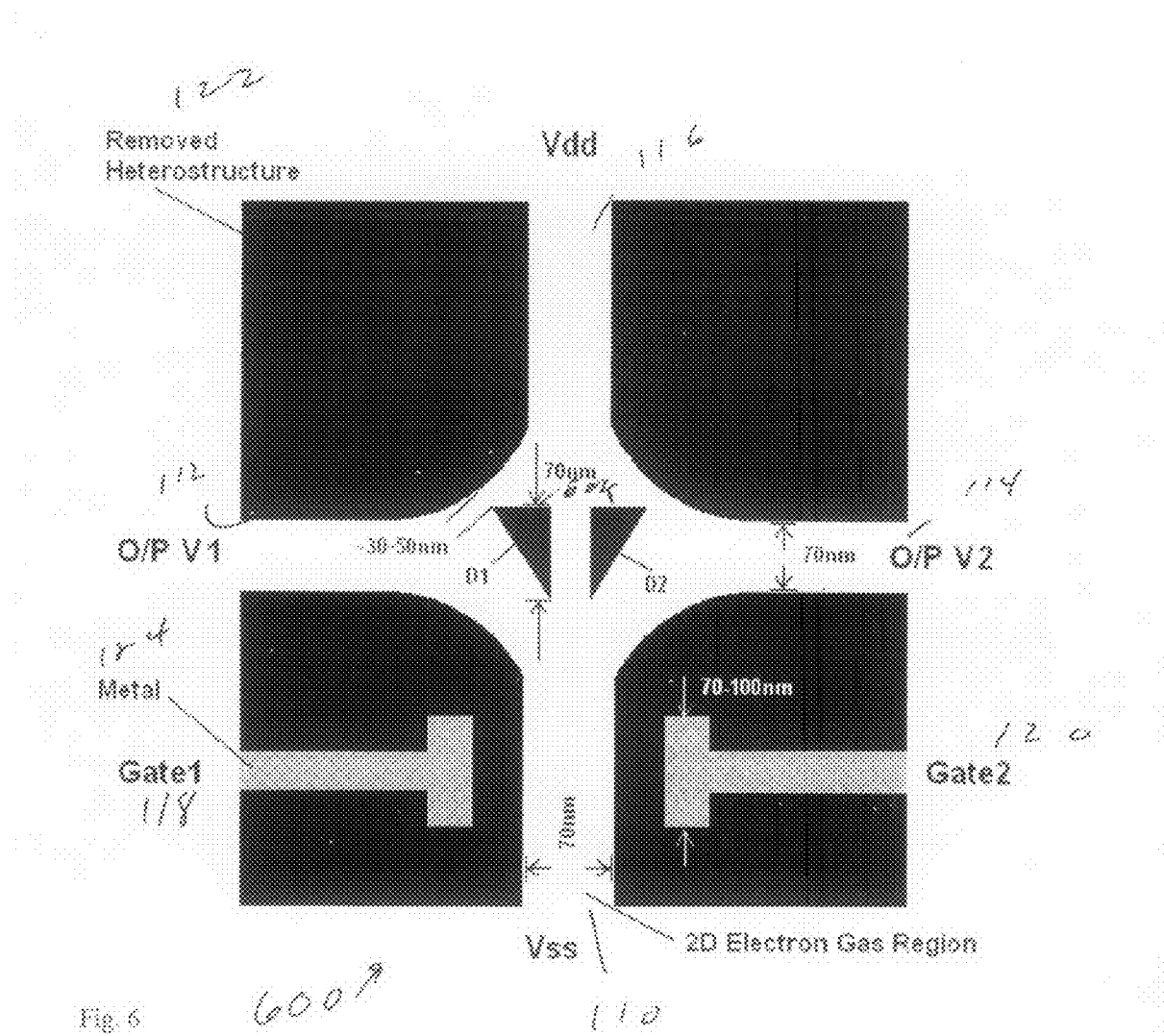
FIG. 6 is a ballistic transistor in which the deflector is composed of two structures, D1 and D2, enabling the additional functionality where by the electron path will be a short circuit if no gate bias is provided.

In the transistor 600 of FIG. 6, the deflector 106 is replaced by two deflectors 602. If no gate bias is provided, the transistor defines a short circuit.

Figure 7:
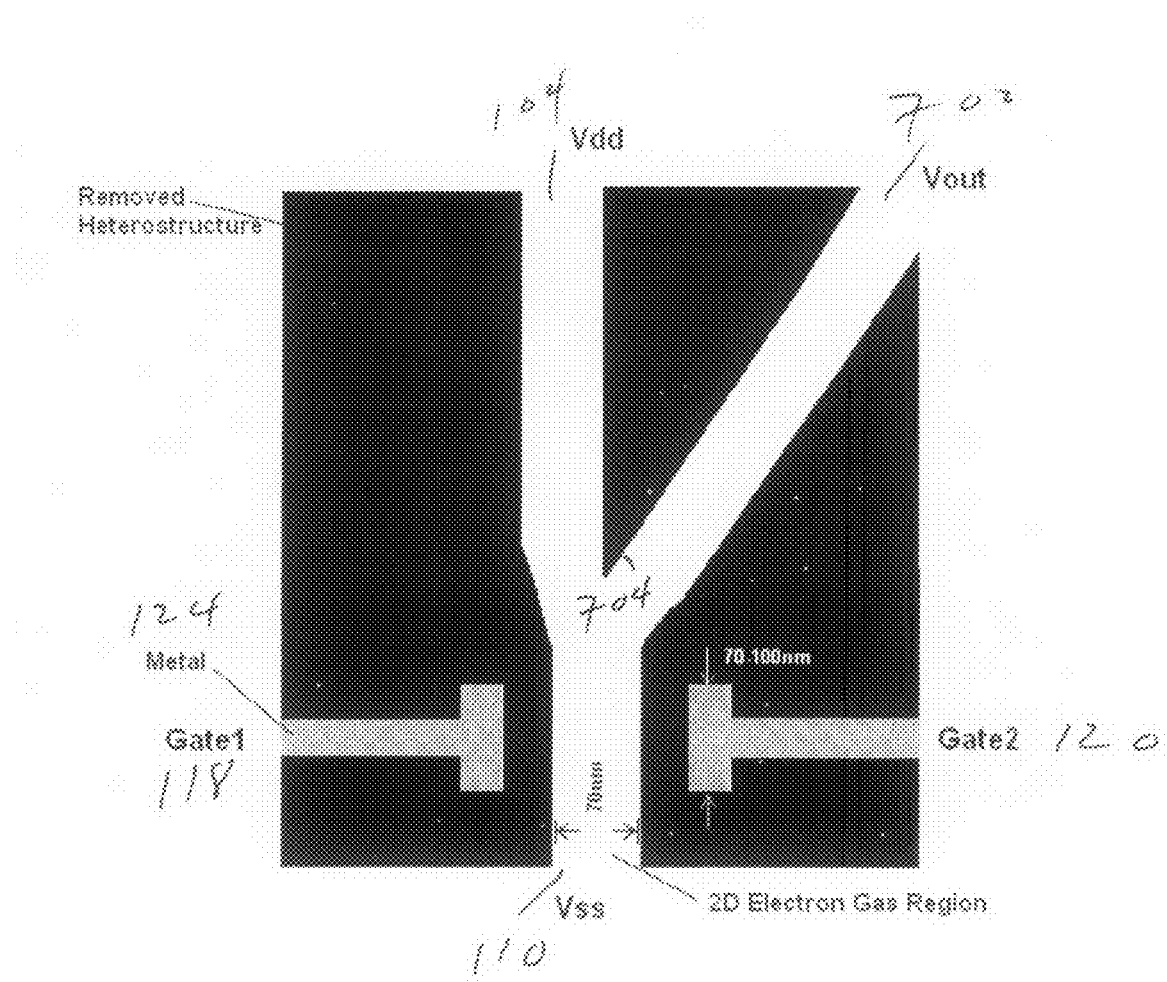
FIG. 7 is a ballistic transistor, which has only one output port, and uses the port interface to act as the deflective structure.

FIG. 7 gives an example of a transistor 700 that has only one output port 702, and where the deflector 704 is integrated into the port design. The fabrication technique is the same as above; however, the geometry is altered as depicted in FIG. 7.

Figure 8A:
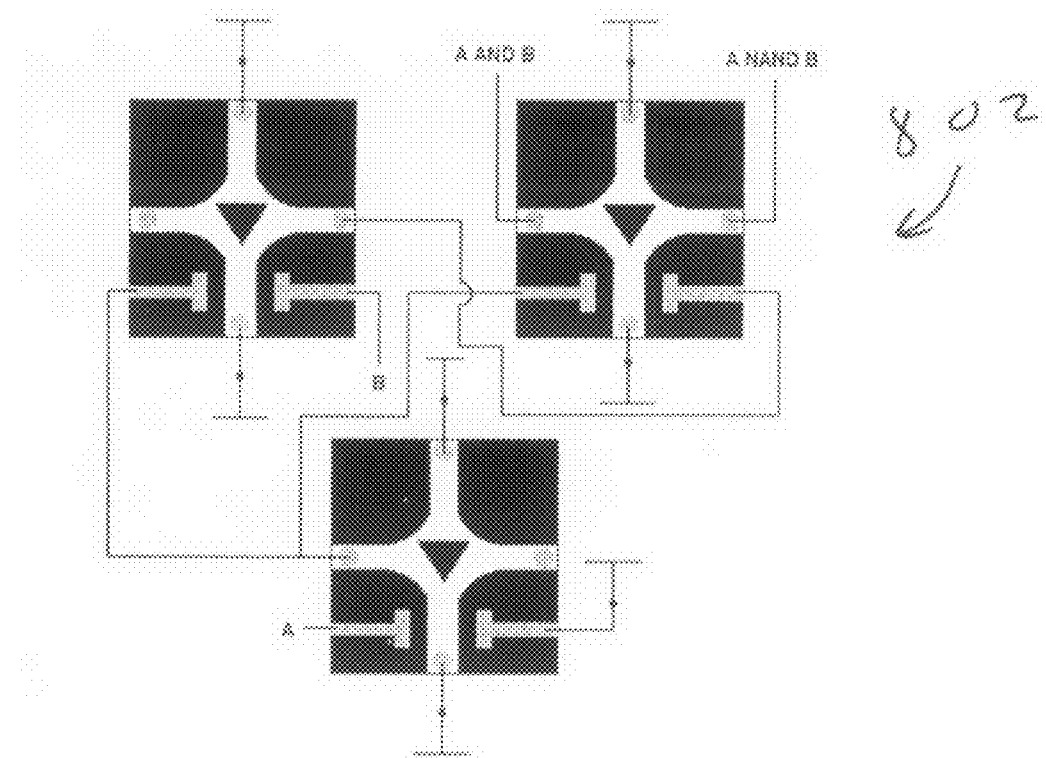
FIG. 8a shows a logical AND/NAND implementation using Ballistic Deflection Transistors (without necessary pull-up resistors shown).
Figure 8B:
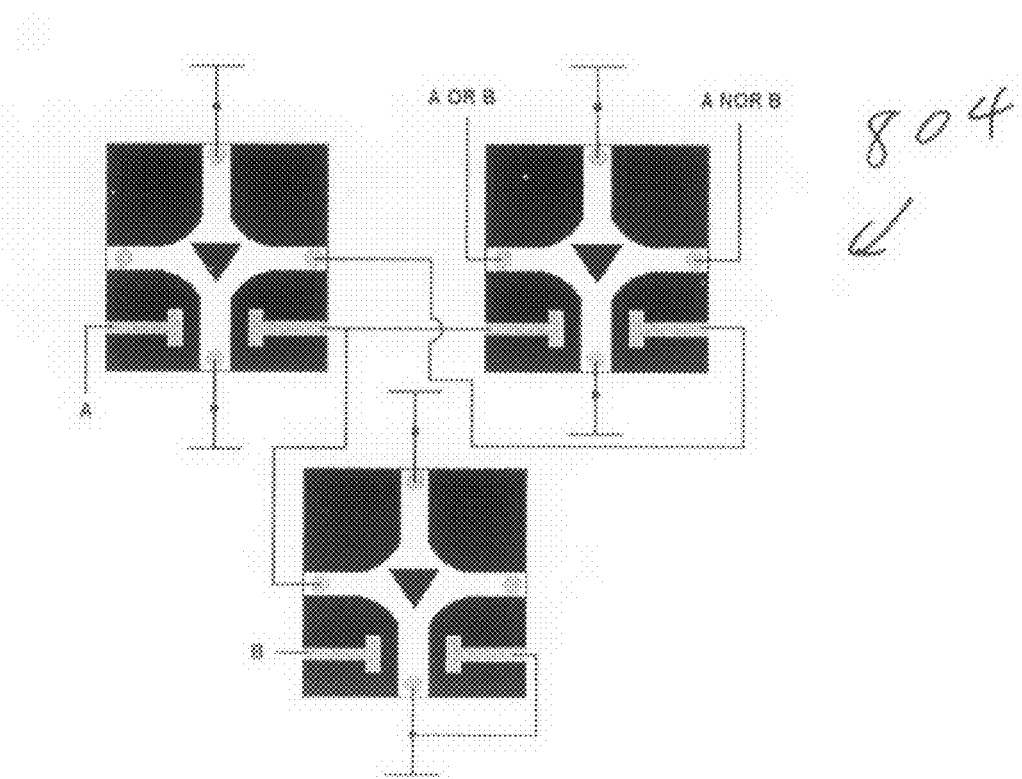
FIG. 8b shows a logical OR/NOR operator implementation (without necessary pull-up resistors shown).

Realizing the high-speed logic potential of this structure, we propose two gate structures. The schematic structures of an AND/NAND gate 802 is depicted in FIG. 8a, and a Logical OR/NOR operator 804 is depicted in FIG. 8b. Note that both the logic function and its complement are available in these circuits. This transistor architecture supports Ternary Logic, providing the designer with the ability to design logic based upon 3 states rather than the conventional two state structures. The circuits shown are the conventional 2-state or base-2 type logic circuits. Pull-up (bias) resistors will be used in real-world implementations; such resistors will be described below with reference to FIG. 15.

These structures operate at a speed that is comparable to an individual Ballistic Deflection Transistor. Several of these basic gates can be used to build higher logic functions. The applications of this design technique could lead to ultra fast microprocessors, and digital signal processors, operating at room temperature and THz frequencies.

Figure 9:
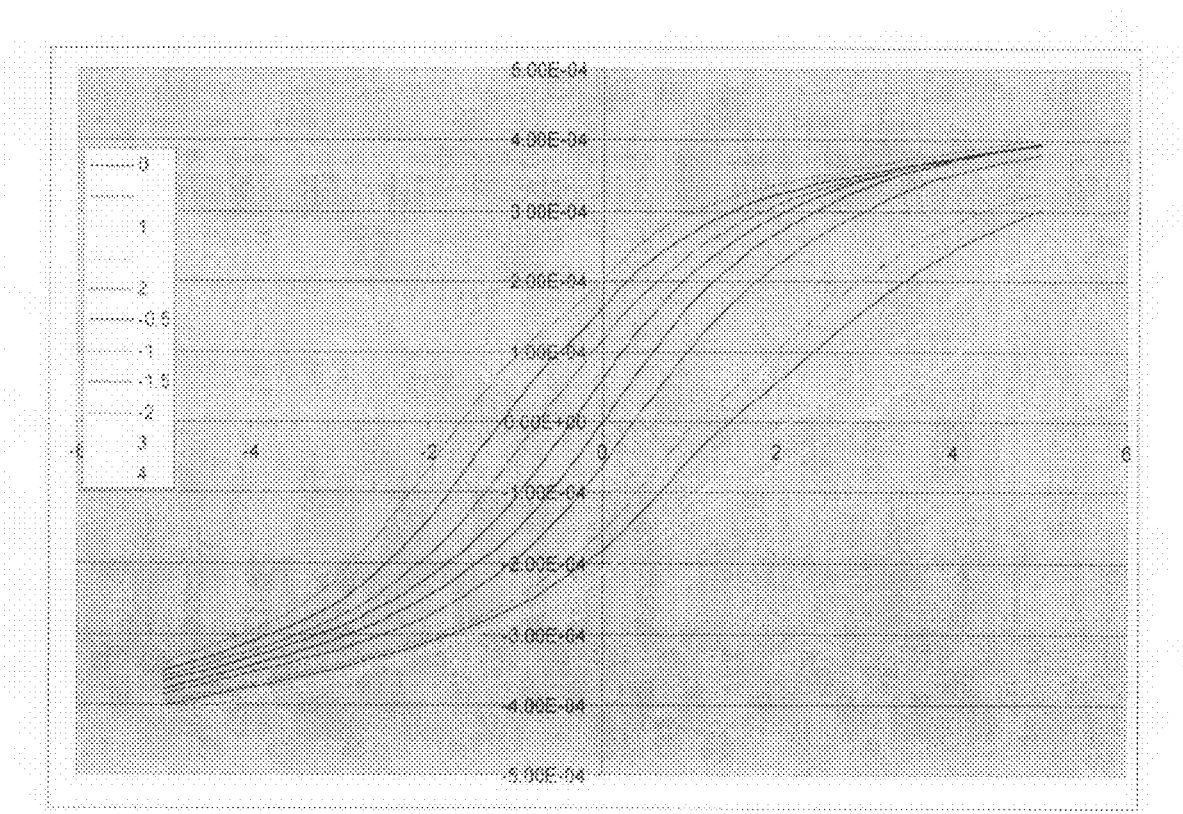
FIG. 9 shows IV Curves for a BDT Channel and shows that transport through the channel is clearly non-linear.

FIG. 9 shows Current versus Voltage measurements take as of Feb. 17, 2006. The Vdd port was connected to a voltage source and was fixed for each measurement at a specified voltage. The Vout1 and Vout2 ports of the device were connected to a voltage sweep. The Vss port was grounded. The gates were unused in these measurements. The scale of the geometry in these measurements comprised a triangular section deflector of 300 nm×150 nm (width×height). The vertical units are in Amps, the horizontal units are in Volts, the family of curves names correspond to the Vdd port voltage. These curves show the channel behavior without any gate function. To a certain extent they can be thought of as the expected behavior of the transistor.

Figure 10:
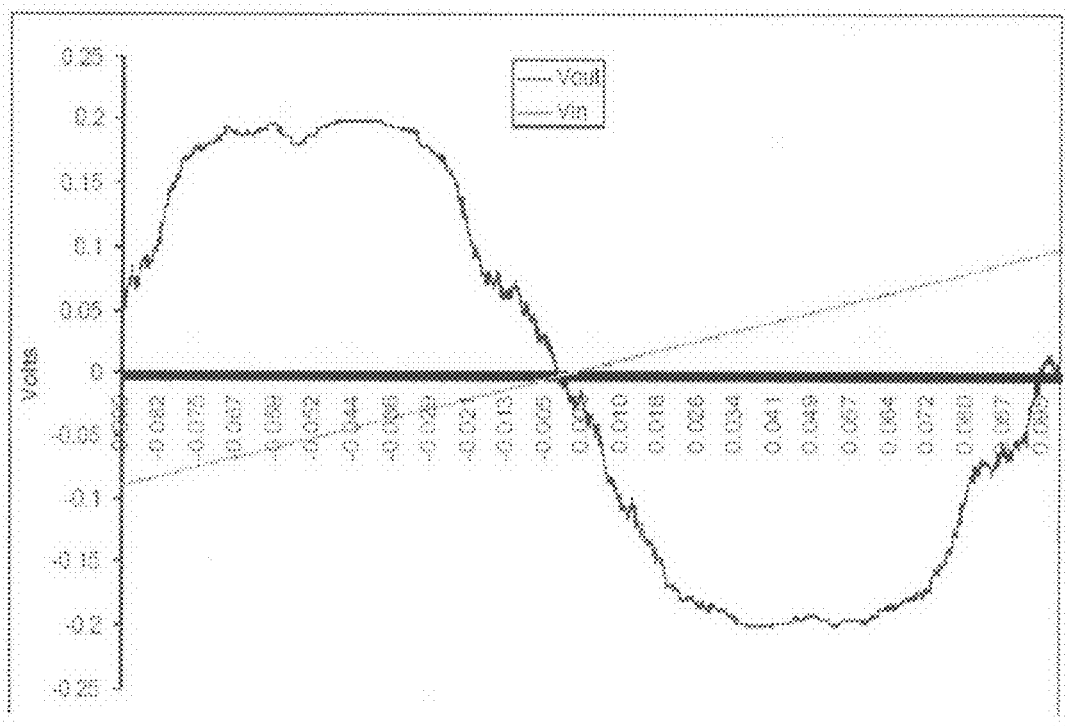
FIG. 10 shows a simulation of room-temperature BDT switching.

Our simulations use a classical billiard model, treating the electrons as ballistic Newtonian particles with effective mass and a thermal distribution under the influence of electromagnetic fields. This accords best with intuition and gives at least qualitatively correct results for most of the experimental results in the literature. It is a full custom Monte Carlo simulator written in an object-oriented language. A typical result is seen in FIG. 10, which assumes operation at room temperature. The gate voltage is ramped from negative to positive, and when the gate voltage passes through zero the output voltage switches from positive to negative. Gate voltage less than 30 mV gives a gain of 7.2 in this example. Then there is a wide range of gate voltage for which the output voltage is quite flat, which implies wide parameter margins. The parameters chosen for FIG. 10 are not optimized. Much higher gains are seen with choice of other parameters. Or higher voltages can be utilized if that is desirable for improved thermal stability or dynamic range.

The power consumption of the BDT is low. Here is a rough order-of-magnitude estimate. Microchannel theory gives a contact resistance of $R_0=h/2e^2=12.9$ kΩ per channel, with no voltage drop along the channel itself. The dimensions of FIG. 1 imply about ten parallel channels. Assuming 180 mV output as in FIG. 10, then $V^2/2R=12$ μW. This is orders of magnitude less than indium phosphide transistors. Note that ballistic conduction is not intrinsically dissipative, so there should be new opportunities for low power design.

We expect the BDT to operate up to a THz and beyond. Most familiar logic paradigms are "voltage state" where data is coded by charge across a capacitor, and the speed is limited by the RC time. But the BDT is the dual, an example of "current-state" logic where data is coded by the direction of current flow, and the speed is limited by the L/R time. (Cryogenic superconducting logic is also currentstate, and also limited by L/R times). Microchannels are dominated by the quantum inductance, roughly $\lambda R_0/2v_F$ per channel. We expect Fermi velocity $v_F=500$ km/sec and mean free path=140 nm so $f_{MAX} \sim R/2\pi L \sim 1$ THz. This sketchy estimate of THz operation for BDTs agrees with other models—they consistently predict that the ballistic rectifier other ballistic devices will operate to at least THz frequencies.

There are good reasons to believe that the BDT will be an extremely low-noise transistor. Shot noise can be very sub-Poissonian, smoothed out by long-range Coulomb interactions between the carriers in the ballistic region. Thermal noise may be minimal since ballistic transport is not coupled to the heat bath. In fact it is widely believed that ballistic devices can be operated at voltages below the kT/e "limit." Some have reasoned that general considerations give the low voltage limit as $h/e\tau$ rather than kT/e, where $\tau$ is the transit time of the electrons.

Note that the $h/e\tau$ is consistent with the low level of voltage fluctuations seen in FIG. 10, even though kT=26 mV at room temperature. One reason that the BDT may be able to operate below the kT/e limit is that the ballistic electrons are collimated in the Vb channel producing a lower effective temperature. In other words, the spread in lateral velocity of ballistic electrons emerging from the Vb channel is much smaller than kT/e because the channel is so narrow. However, if operation at low voltage proves problematic in 300 K experiments, our simulations show that the BDT can be redesigned to operate at higher voltages, at higher power.

These arguments giving the limits of performance of the BDT cannot be definitive. Very little is known about device performance in the microchannel limit—especially at room temperature. The limits we have identified may be circumvented, as well. For example, here are two simple expedients by which the quantum resistance $h/2e^2$ per channel can be avoided. Multiple BDTs can be interconnected by microchannels rather than resistors. Or the contacts to the BDT electrodes can be capacitive rather than direct, so that the quantum resistance is shorted as in.

Experiments to demonstrate the BDT are underway using InGaAs—InP based 2DEG. The mean free path in InP based heterostructures is a few micrometers at low temperatures and ~140 nm at room temperature.

We have conducted several experiments to resolve the gate steering problems that we have encountered. We have managed to get sufficient gate isolation and proximity to the channel of the BDT to induce field effects. As well we have observed both field effect behavior and steering behavior in the device. The separation of field effect from steering effect is important, as it indicates that all the physics of the device is now present.

Steering effect, unlike field effect, does not deplete the semiconductor while controlling electron flow. Field effect devices induce a depletion region, which has to recombine on every state change. This recombination time determines the limits of the performance of the device. While reducing the size of the geometry, in a field effect device, reduces the number of electrons that have to recombine its performance is still limited by the non-linear capacitance induced. Steering effect essentially eliminates the non-linear capacitance, as no depletion region is induced. This increases the theoretical switching speed of the device, which is now only limited by the typical parallel plate type capacitance and this capacitance is orders of magnitude smaller.

Figure 11:
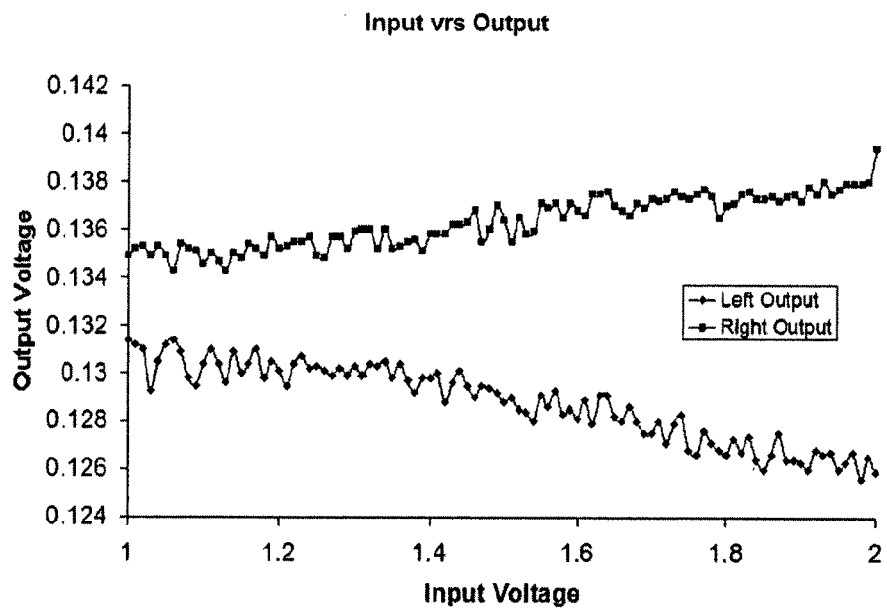
FIG. 11 shows the steering effect induced by lateral fields.

We have demonstrated that the steering effect is real. FIG. 11 demonstrates the steering effect. By introducing a DC offset that is well above the depletion voltage, we can see that there is still a non-linear effect on the channel. While the gains here are below 1, the steering effect is still clearly shown. The results are not gate leakage based as they would have opposite slopes.

Figure 12:
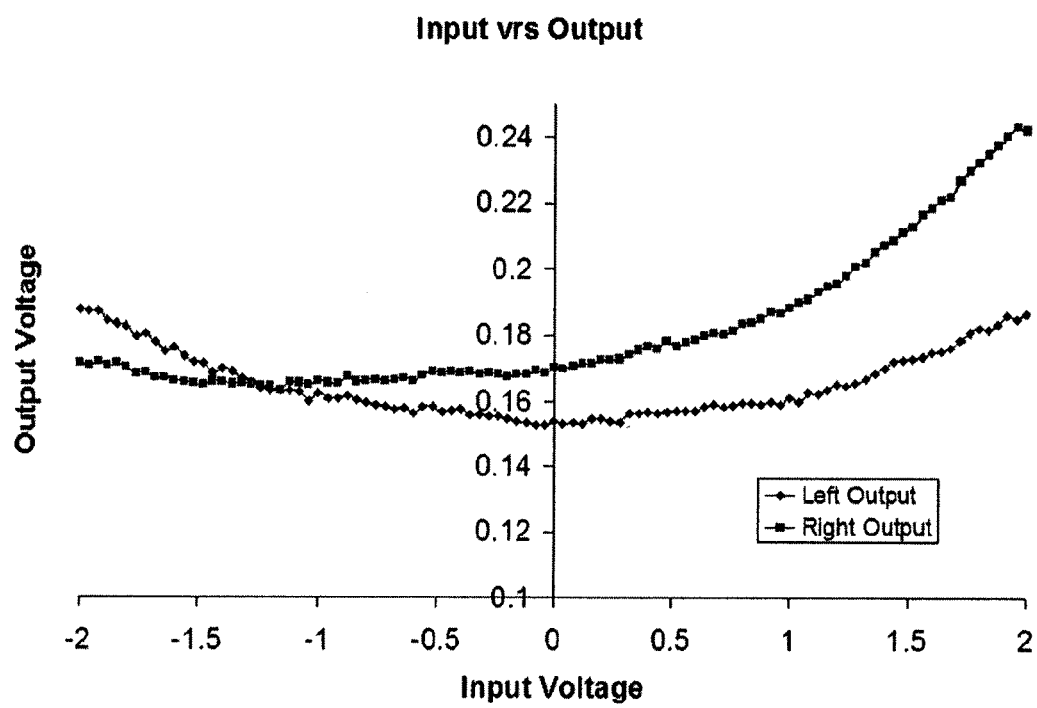
FIG. 12 shows the field effect combined with the steering effect.

It is interesting what happens when field effect is present in the channel of the device. Depletion seems to encompass the whole channel rather than being an effect that stretches out from the gate region. Steering effect is enhanced when the carrier density is reduced by the depletion, this was our first indication that carrier density is having some effect on our ability to steer the electrons. In FIG. 12, the gates are biased between −2 to 2 for the left gate and 2 down to −2 on the right gate. Ideally the outputs will have opposite slopes when steering effect alone is affecting the channel. Clearly we see that field effect is depleting the channel, first due to the left gate, then later due to the right gate. Due to the depletion region, gate leakage is also lower, as well gain of the over all device is higher.

Figure 13:
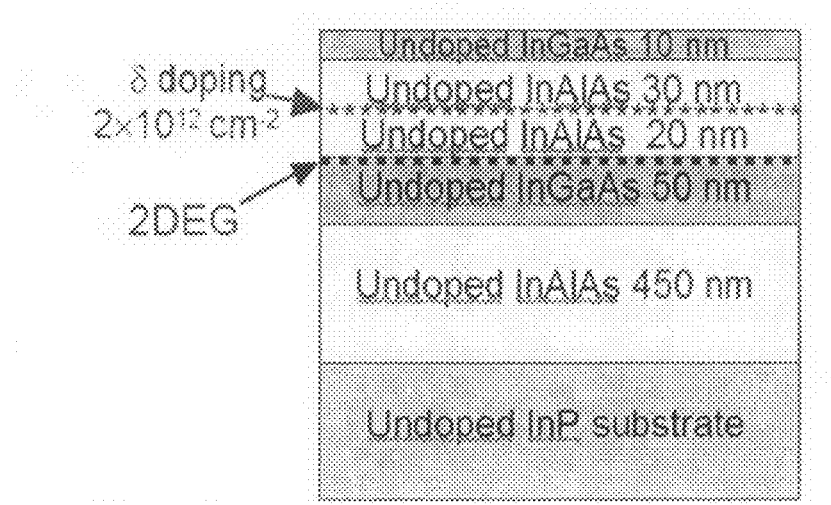
FIG. 13 shows the material system structure used to fabricate the transistor in a preferred embodiment.

Our current material system is shown in FIG. 13. The doping density in the InAlAs layer is approximately $2\times10^{12}$ and the intrinsic carrier density for InAlAs is $1.6\times10^7$. Using these numbers we can approximate the potential at the edge of the channel induced by the etched region.

$$\phi = K_b T \ln(N_d/N_i)$$

$$\phi = 0.0259 \ln(2\times10^{12}/1.6\times10^7) = 0.30 \text{ Volts} \quad (1)$$

This potential is another force that our gates have to overcome and we believe that it is currently the source of our reduced gain. Initial simulations with this applied field indicate a randomizing effect on the channel for our current device geometry. These same simulations indicate that if the potential is reduced below 0.20 volts, steering effects begin to dominate.

In order to reduce the built in potential, we are currently conducting experiments that will reduce the surface states of the material as well as passivate it. Proper passivation will nearly eliminate the built in potential, and the first material we are considering is $Si_2N_3$ for this procedure. Additionally we are examining the effects of various geometry changes, and are fabricating channel only devices to better characterize the steering effect.

Figure 14:
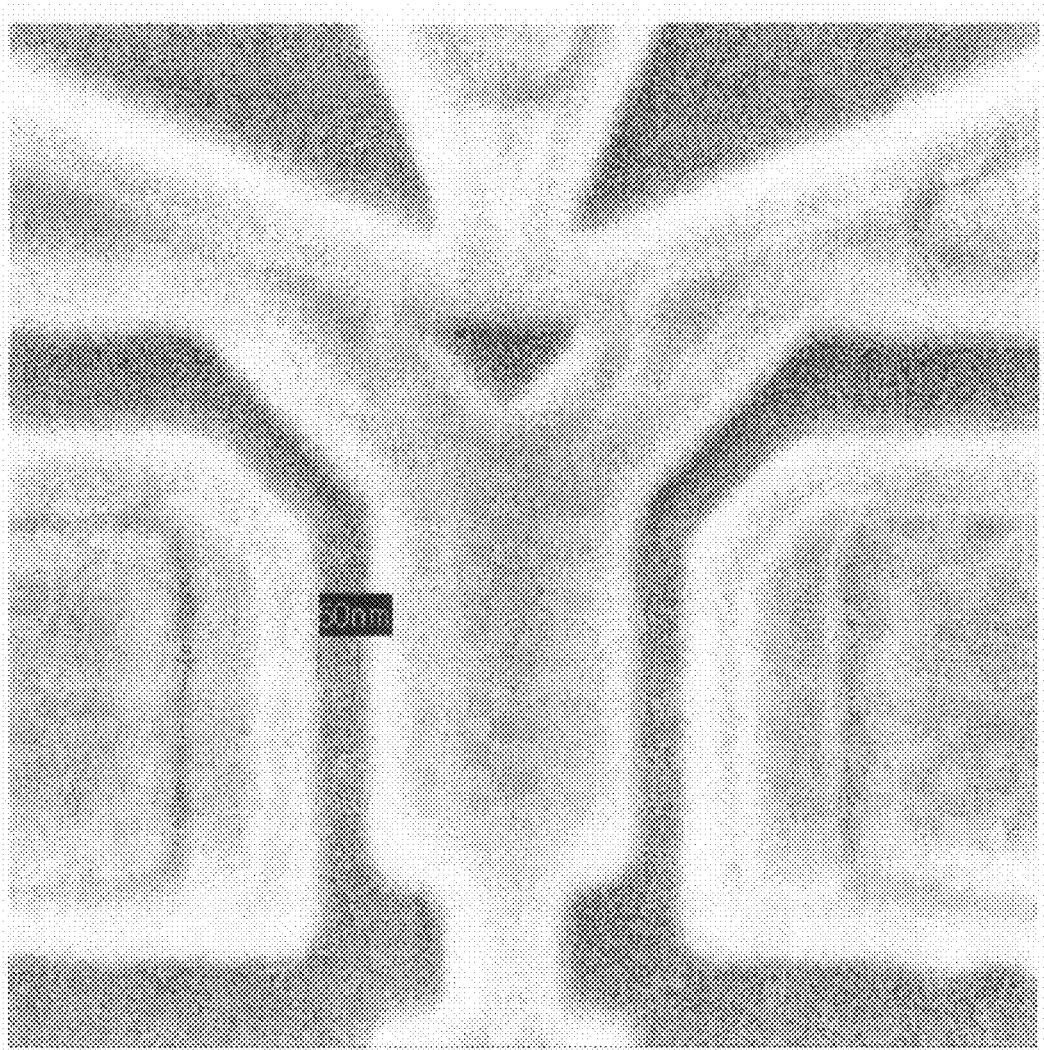
FIG. 14 shows a structure fabricated according to a preferred embodiment.

We have also developed a new fabrication process that enables sub 50 nm resolution in our material system. This new process consists of a Carbon-$SiO_2$ hard-mask. Carbon is evaporated onto our substrate as well as a thin layer of $SiO_2$. PMMA resist is patterned, and the thin layer of $SiO_2$ is removed via a $CF_4$ RIE etch. The carbon in the selected region is then removed with an $O_2$ plasma in the RIE. We have found this Carbon mask exceptionally resistant, with very high selectivity (approximately 1:10 Carbon to substrate), and is suitable for both RIE and Ion Mill etch techniques. FIG. 14 shows an example of a device fabricated using the new techniques.

Figure 15:
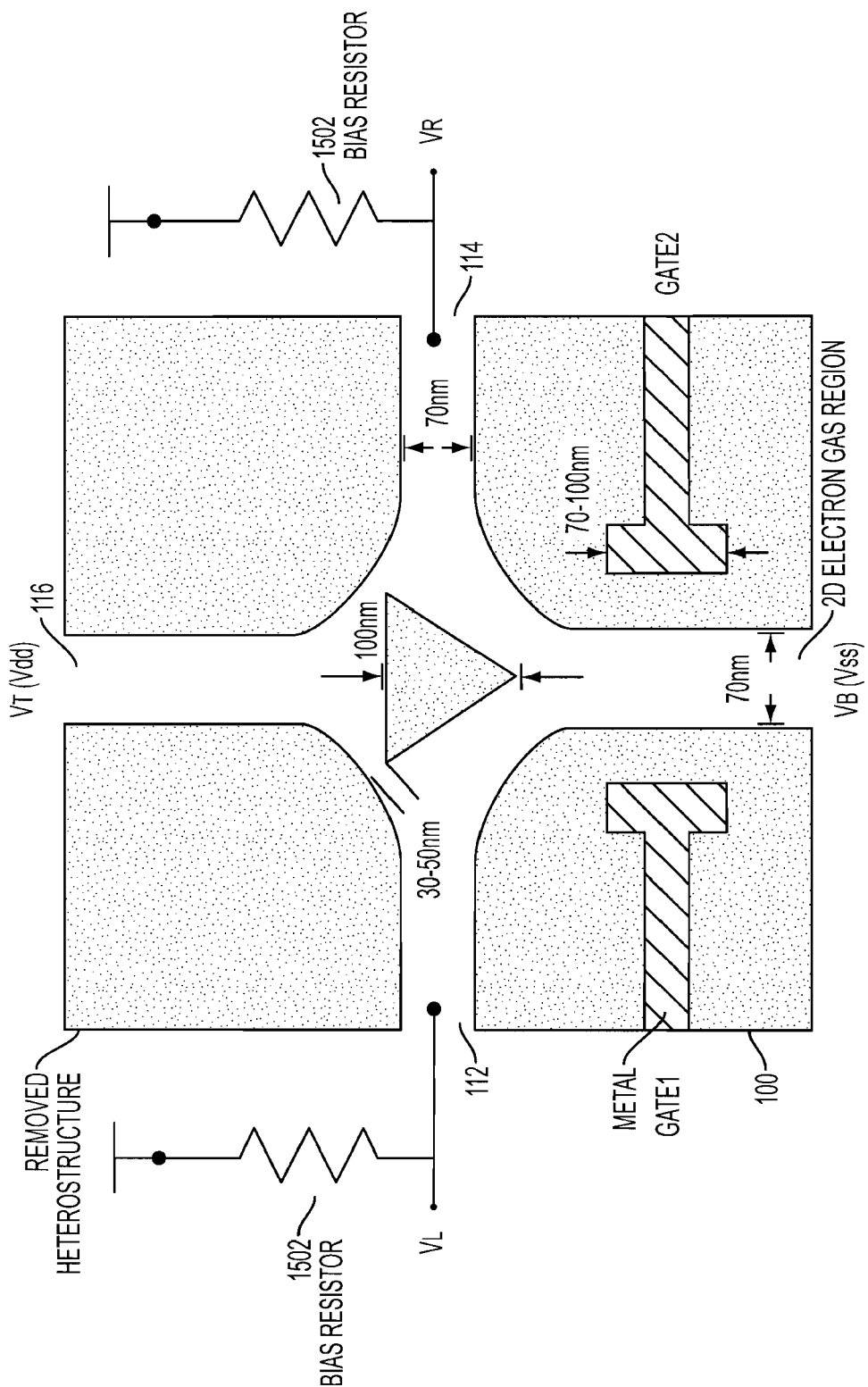
FIG. 15 shows biasing of the transistor.

The use of bias voltage on the output ports will now be discussed. FIG. 15 shows a transistor 100 to which bias resistors 1502 are connected to hold ports 112 and 114 to voltages $V_L$ and $V_R$ respectively. The port 116 can similarly be biased to a voltage $V_T$. All of the output ports 112, 114, 116 can be connected to That has the effect of holding all of the ports labeled in FIG. 1 as 112, 114 and 116 to Vdd, such that V1=V2=Vdd.

Figure 16:
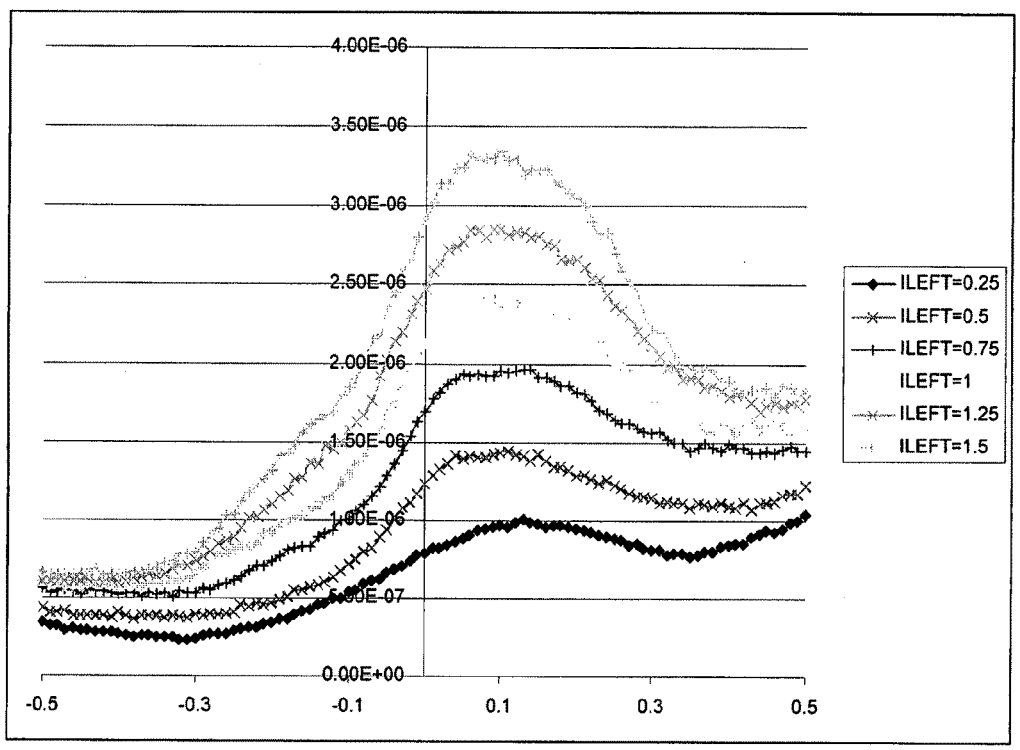
FIGS. 16-18 are IV curves for ports V1, V2 and Vdd, respectively, experimentally verified, from the transistor of FIG. 14 to which a bias is applied as shown in FIG. 15.
Figure 17:
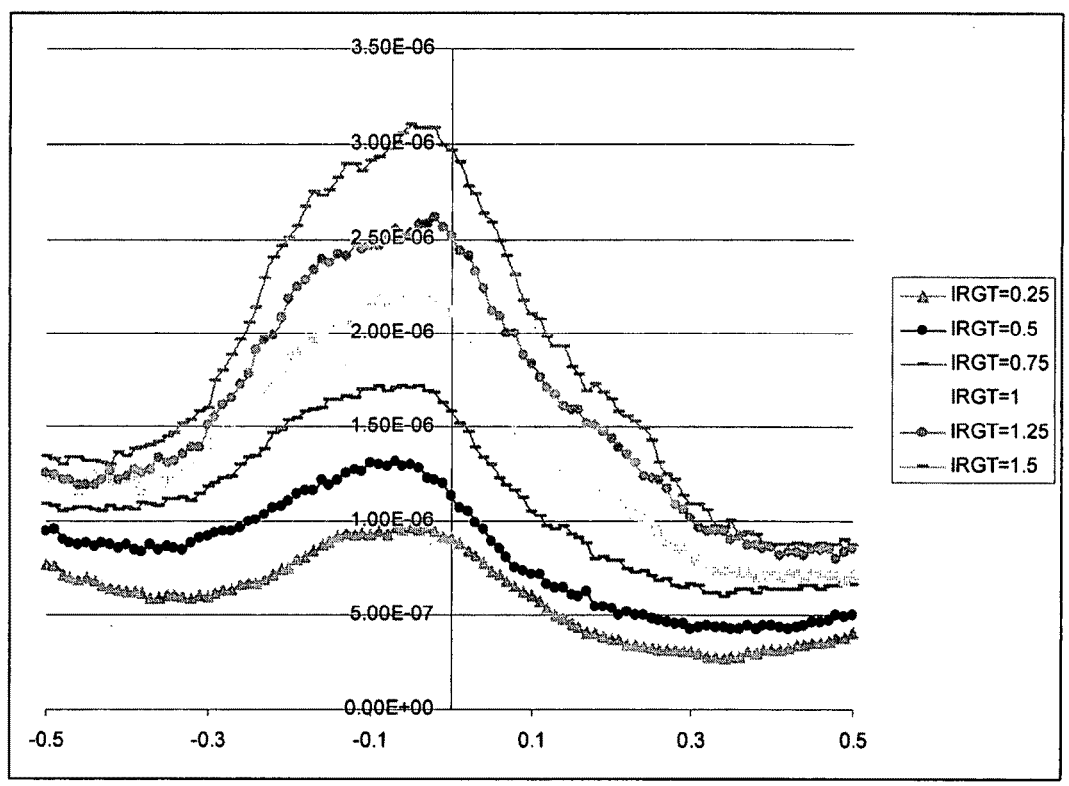
Figure 18:
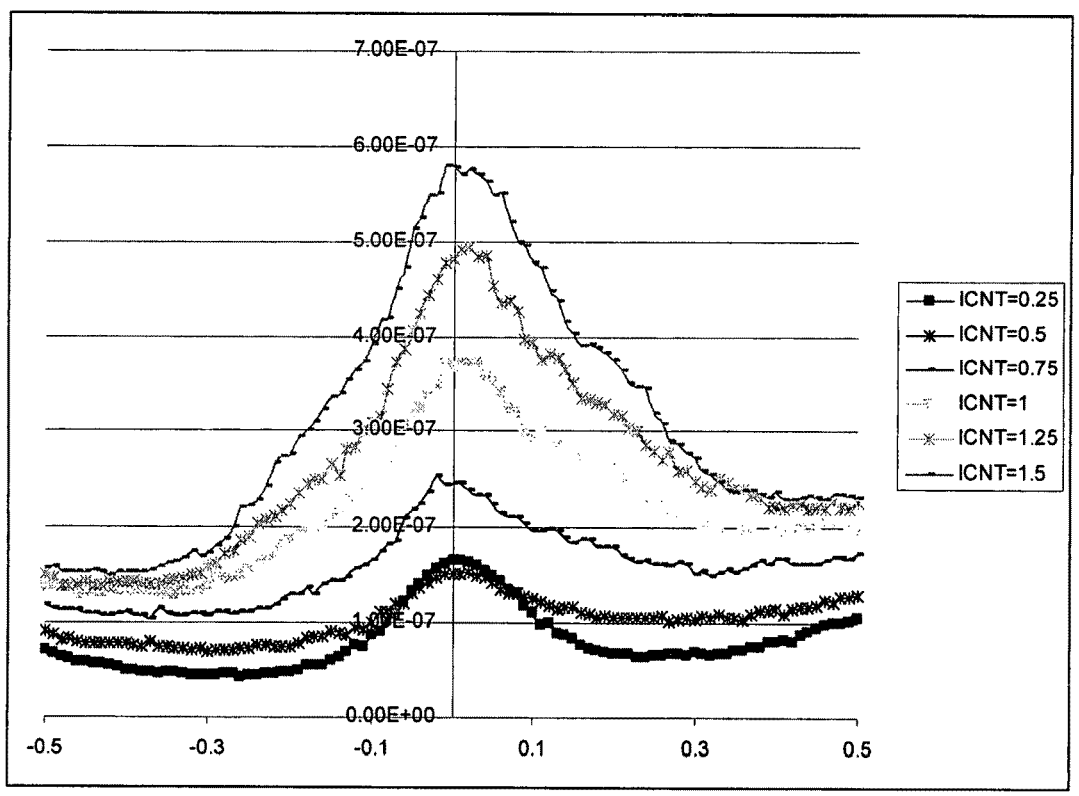

Experimental results from such biasing will now be disclosed. FIGS. 16-18 are IV characteristics for FIG. 14. All three graphs were generated by applying an equal bias voltage to the left, top, and right port of the device, as explained above with reference to FIG. 15. Thus, as noted above, V1=Vdd=V2.

FIG. 16 shows current in Amps versus gate push-pull voltage in volts for the Left port of a BDT biased at 0.25, 0.5, 0.75, 1, 1.25, and 1.5 volts.

FIG. 17 shows current in Amps versus gate push-pull voltage in volts for the Right port of a BDT biased at 0.25, 0.5, 0.75, 1, 1.25, and 1.5 volts.

FIG. 18 shows current in Amps versus gate push-pull voltage in volts for the center (Vdd) port of a BDT biased at 0.25, 0.5, 0.75, 1, 1.25, and 1.5 volts.

Figure 19:
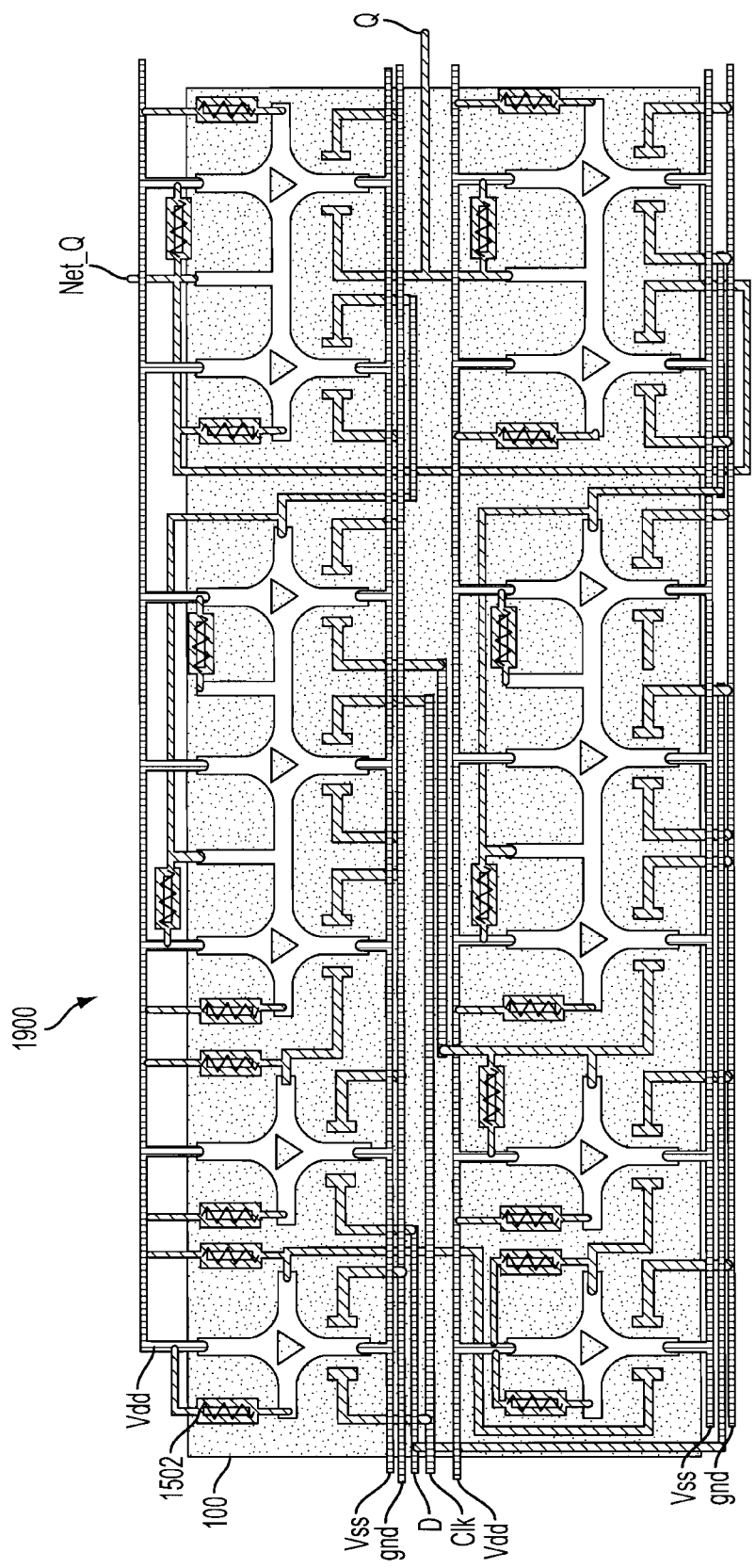
FIG. 19 shows a delay flip flop using Ballistic Deflection Transistors and biasing resistors.

FIG. 19 shows a delay flip flop 1900 implemented using the transistors 100 and pull-up resistors 1502 described above. The flip flop 1900 has an output Q, and Not_Q is fed back as a bias voltage.

While preferred embodiments of the present invention have been set forth in detail above, those skilled in the art who have reviewed the present disclosure will readily appreciate that other embodiments can be realized within the scope of the invention. For example, numerical values, materials, and fabrication techniques are illustrative rather than limiting. Moreover, passivation of the channel is mentioned using silicon nitride, but titanium oxide as well as any other suitable passivation material can be used. Therefore, the present invention should be construed as limited only by the appended claims.

We claim:

1. A ballistic deflection transistor comprising:
a substrate;
a quantum well formed in the substrate;
a plurality of paths in the substrate to define a hub and a plurality of ports extending from the hub;
a deflective structure formed in the hub; and
a plurality of gates formed in the substrate to be adjacent to one of the ports to apply a capacitive or inductive field to electrons entering at said one of the ports.

2. The ballistic deflection transistor of claim 1, wherein the gates comprise strips of conductive material applied onto the substrate.

3. The ballistic deflection transistor of claim 1, wherein the gates are formed by isolating semiconductor by an etch.

4. The ballistic deflection transistor of claim 1, wherein the deflective structure comprises a triangular structure in the hub.

5. The ballistic deflection transistor of claim 4, wherein the deflective structure comprises two triangular structures in the hub.

6. The ballistic deflection transistor of claim 4, wherein the plurality of ports comprise two output ports extending from the hub.

7. The ballistic deflection transistor of claim 6, wherein the two output ports extend in opposite directions from the hub.

8. The ballistic deflection transistor of claim 1, wherein the deflective structure comprises a portion of the substrate disposed at as location at which two of the ports join at the hub.

9. A method of forming a ballistic deflection transistor, the method comprising:

(a) providing a substrate;
(b) forming a quantum well in the substrate so as to define a plurality of paths in the substrate to define a hub, a plurality of ports extending from the hub and a deflective structure formed in the hub; and
(c) forming a plurality of gates in the substrate to be adjacent to one of the ports to apply a capacitive or inductive field to electrons entering at said one of the ports.

10. The method of claim 9, wherein step (b) comprises etching the substrate.

11. The method of claim 10, wherein step (b) further comprises doping the substrate.

12. The method of claim 11, wherein the substrate comprises InGaAs.

13. The method of claim 12, wherein the substrate further comprises InAlAs.

14. The method of claim 13, wherein the substrate further comprises InP.

15. The method of claim 13, wherein the substrate is doped to further comprise AlGaAs.

16. The method of claim 11, wherein said etching is performed using a carbon-$SiO_2$ mask.

17. The method of claim 16, wherein the mask is etched by removing the $SiO_2$ with a $CF_4$ RIE etch and by removing the carbon with an $O_2$ plasma.

18. The method of claim 9, wherein step (c) comprises depositing a conductor on the substrate.

19. The method of claim 18, wherein the substrate comprises a metal.

20. The method of claim 9, wherein step (c) comprises isolating semiconductor by an etch.

21. A logic circuit comprising:
(a) a plurality of ballistic deflection transistors, each of the plurality of ballistic deflection transistors comprising:
a substrate;
a quantum well formed in the substrate;
a plurality of paths in the substrate to define a hub and a plurality of ports extending from the hub;
a deflective structure formed in the hub; and
a plurality of gates formed in the substrate to be adjacent to one of the ports to apply a capacitive or inductive field to electrons entering at said one of the ports; and
(b) conductors for interconnecting the plurality of ballistic deflection transistors to form the logic circuit.

22. The logic circuit of claim 21, wherein the ports in each of the transistors comprise output ports, and further comprising:
a line for supplying a bias voltage; and
circuitry for supplying the bias voltage to the output ports of the transistors.

23. The logic circuit of claim 22, wherein the circuitry comprises bias resistors.

* * * * *